United States Patent
Kelly

(10) Patent No.: US 11,948,045 B2
(45) Date of Patent: Apr. 2, 2024

(54) IN-SITU QUANTUM ERROR CORRECTION

(71) Applicant: Google LLC, Mountain View, CA (US)

(72) Inventor: Julian Shaw Kelly, Santa Barbara, CA (US)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 18/304,253

(22) Filed: Apr. 20, 2023

(65) Prior Publication Data
US 2023/0267355 A1 Aug. 24, 2023

Related U.S. Application Data

(60) Continuation of application No. 17/401,798, filed on Aug. 13, 2021, now Pat. No. 11,651,265, which is a
(Continued)

(51) Int. Cl.
*G06F 11/07* (2006.01)
*G06F 11/08* (2006.01)
(Continued)

(52) U.S. Cl.
CPC ......... *G06N 10/00* (2019.01); *G06F 11/0751* (2013.01); *G06F 11/0787* (2013.01);
(Continued)

(58) Field of Classification Search
CPC ... G06F 11/0751; G06F 11/0787; G06F 11/08
See application file for complete search history.

(56) References Cited

U.S. PATENT DOCUMENTS

| | | | |
|---|---|---|---|
| 6,128,764 A | 10/2000 | Gottesman | |
| 9,858,531 B1 | 1/2018 | Monroe et al. | |

(Continued)

FOREIGN PATENT DOCUMENTS

| | | |
|---|---|---|
| AU | 2015413915 | 5/2018 |
| CN | 1672171 | 9/2005 |

(Continued)

OTHER PUBLICATIONS

Blume-Kohout, "Controlling qubit drift by recycling error correction syndromes". APS March Meeting 2015; Bulletin Jf the American Physical Society, vol. 60, No. 1, T38.12, Dec. 29, 2014 (Dec. 29, 2014), XP055291077, retrieved from the Internet: URL: http://absimage.aps.org/image/MAR15/MWS;Mar15-2014-000517.pdf [retrieved on Mar. 2, 2015] abstract, 2 pages.

(Continued)

*Primary Examiner* — Jigar P Patel
(74) *Attorney, Agent, or Firm* — Fish & Richardson P.C.

(57) ABSTRACT

Methods, systems, and apparatus for parallel optimization of continuously running quantum error correction by closed-loop feedback. In one aspect, a method includes continuously and effectively optimizing qubit performance in-situ whilst an error correction operation on the quantum system is running. The method directly monitors the output from error detection and provides this information as feedback to calibrate the quantum gates associated with the quantum system. In some implementations, the physical qubits are spatially partitioned into one or more independent hardware patterns, where the errors attributable to each hardware pattern are non-overlapping. The one or more different sets of hardware patterns are then temporarily interleaved such that all physical qubits and operations are optimized. The method allows for the optimization of each section of a hardware pattern to be performed individually and in parallel, and can result is O(1) scaling.

16 Claims, 8 Drawing Sheets

Related U.S. Application Data continuation of application No. 16/905,372, filed on Jun. 18, 2020, now Pat. No. 11,106,992, which is a division of application No. 15/774,028, filed as application No. PCT/US2015/059481 on Nov. 6, 2015, now Pat. No. 10,692,009.

(51) Int. Cl.
  *G06N 10/00* (2022.01)
  *G06N 99/00* (2019.01)
  *H01L 29/66* (2006.01)
  *H10N 60/80* (2023.01)

(52) U.S. Cl.
  CPC ............ *G06F 11/08* (2013.01); *G06N 99/00* (2013.01); *H01L 29/66977* (2013.01); *H10N 60/805* (2023.02)

(56) References Cited

U.S. PATENT DOCUMENTS

| | | | |
|---|---|---|---|
| 11,106,992 B2 | 8/2021 | Kelly | |
| 2016/0125311 A1* | 5/2016 | Fuechsle | H10N 60/80 257/31 |
| 2016/0344414 A1* | 11/2016 | Naaman | H03M 13/1525 |
| 2017/0005255 A1* | 1/2017 | Dial | H01L 29/66977 |
| 2018/0181685 A1* | 6/2018 | Roetteler | G06N 10/00 |

FOREIGN PATENT DOCUMENTS

| | | |
|---|---|---|
| CN | 101868802 | 10/2010 |
| CN | 104050509 | 9/2014 |
| CN | 104919476 | 9/2015 |
| JP | 2006-331249 | 12/2006 |
| JP | 2010-233066 | 10/2010 |
| WO | WO 2017078734 | 5/2017 |

OTHER PUBLICATIONS

Bombin, "Single-shot fault-tolerant quantum error correction," Physical Review X. vol. 5, 031043, Sep. 28, 2015 (Sep. 28, 2015), XP055291080, DOI: IO.II03/PhysRevx.5.031043; the whole document, 26 pages.

Bouwmeester et al., "The Physics of Quantum Information: Quantum Cryptography, Quantum Teleportation" Quantum Computation, Japan, Kyoritsu Publishing Co., Ltd., May 25, 2007 (year/month/day), First Edition, pp. 304-308, ISBN978-4-320-03431-0.

Combes et al., "In-situ characterization of quantum devices with error correction".; arXiv:1405.5656v1, May 22, 2014 (May 22, 2014), XP055291078, retrieved from the Internet: URL<https://arxiv.org/abs/1405.5656v1 [retrieved on May 23, 2014] the whole document, 16 pages.

Hutter et al., "Continuous error correction for I sing anyons". arXiv:1508.04033vl, Aug. 17, 2015 (Aug. 17, 2015) ZP055291082, Retrieved from the Internet: URL:https://arxiv.org/abs/1508.04033v1; [retrieved on Aug. 18, 2015] the whole document, 8 pages.

International Preliminary Report on Patentability in International Appln. No. PCT/US2015/059481, dated May 17, 2018, 9 pages.

International Search Report and Written Opinion in International Appln. No. PCT/US2015/059481, dated Aug. 3, 2016, 15 pages.

JP Office Action in Japanese Application No. 2018-544018, dated Sep. 2, 2019, 6 pages.

JP Office Action in Japanese Application No. 2021-57303, dated Mar. 14, 2022, 10 pages (with English translation).

Kelly: "Fault-tolerant superconducting qubits". Dissertation for Ph.D. in Physics at University of California, Mar. 2015 (Mar. 2015), XP055289024, Retrieved from the Internet: URL:http://web.physics.ucsb.edu/martinisgroup/theses/Kelly2015.pdf, [retrieved on May 14, 2015], chapters 2, 5, and 8; appendices C and E, 101 pages.

KR Office Action in Korean Application No. 10-2018-7016189, dated Nov. 18, 2020, 9 pages (with English translation).

Office Action in Australian Appln. No. 2015413915, dated May 6, 2019, 19 pages.

Office Action in Australian Appln. No. 2019275671, dated Aug. 25, 2020, 4 pages.

Office Action in Australian Appln. No. 2021200696, dated Nov. 16, 2021, 3 pages.

Office Action in Australian Appln. No. 2022218621, dated Jul. 10, 2023, 3 pages.

Office Action in Canadian Appln. No. 3,004,633, dated Mar. 11, 2019, 11 pages.

Office Action in Canadian Appln. No. 3,004,633, dated Sep. 23, 2021, 3 pages.

Office Action in Chinese Appln. No. 201580085604.3, dated May 27, 2021, 14 pages (with English translation).

Office Action in European Appln. No. 15795313.4, dated Jun. 8, 2021, 8 pages.

Office Action in Indian Appln. No. 201847021145, dated Dec. 24, 2020, 7 pages (with English translation).

Tokunaga, "Error Correction Technology for Quantum Computer—Physically Well-designed Topological Surface Code" Information Processing, Japan, Information Processing Society of Japan, Jun. 15, 2014 (year/month/day), vol. 55, No. 7 (No. 592 in total), pp. 695-701, ISSN 0447-8053.

Wang et al, "Overlapping method-based quantum code CNOT gate extended rectangular fault-tolerant structure" Chinese Journal of Quantum Electronics, Mar. 2014, 7 pages.

\* cited by examiner

IN-SITU QUANTUM ERROR CORRECTION

CROSS-REFERENCE TO RELATED APPLICATIONS

This application is a continuation application of, and claims priority to, U.S. patent application Ser. No. 17/401,798, titled "IN-SITU QUANTUM ERROR CORRECTION," filed on Aug. 13, 2021, which is a continuation application of, and claims priority to, U.S. patent application Ser. No. 16/905,372, now U.S. Pat. No. 11,106,992, titled "IN-SITU QUANTUM ERROR CORRECTION," filed on Jun. 18, 2020, which application is a divisional application of, and claims priority to, U.S. patent application Ser. No. 15/774,028, now U.S. Pat. No. 10,692,009, titled "IN-SITU QUANTUM ERROR CORRECTION," filed on May 7, 2018, which application is a National Stage Application under 35 U.S.C. § 371 and claims the benefit of International Application No. PCT/US2015/059481, filed Nov. 6, 2015. The disclosure of each of the foregoing applications is incorporated herein by reference in their entirety for all purposes.

BACKGROUND

Optimization of physical gate parameters is required for constructing fault-tolerant quantum computers. Characterization methods such as randomized benchmarking or tomography require interruption of necessary error detection operations and do not guarantee optimal performance in an error correction circuit. Optimization of physical gate parameters using error model optimization methods requires that an error model is trained, such that measured physical errors may be linked to physical gates, and requires that the determined errors are linked back to changes in control parameters, increasing the complexity of the optimization process.

SUMMARY

This specification relates to qubit performance in quantum computations.

This specification describes technologies relating to the continuous and parallel optimization of qubit performance in-situ whilst an error correction operation on a quantum system is running.

In general, one innovative aspect of the subject matter described in this specification can include the actions of accessing a quantum information storage system that comprises a plurality of data qubits; a plurality of measurement qubits, interleaving the data qubits such that each data qubit has a neighboring measurement qubit; a plurality of readout quantum gates, each readout quantum gate configured to operate on a measurement qubit; a plurality of single qubit quantum gates, each single qubit quantum gate configured to operate on a data qubit or a measurement qubit; and a plurality of CNOT quantum gates, each CNOT quantum gate configured to operate on a data qubit and a neighboring measurement qubit, and each CNOT gate defines one of a plurality of directions; partitioning data qubits and measurement qubits into a plurality of patterns, where at least one pattern is subject to non-overlapping errors for the pattern, wherein a non-overlapping error for a pattern is an error that is attributable to the pattern; for a pattern that includes measurement qubits: optimizing in parallel parameters of readout quantum gates that operate on the measurement qubits; and optimizing in parallel parameters of single qubit quantum gates that operate on the measurement qubits; for a pattern that includes data qubits and measurement qubits that are operated on by CNOT gates: optimizing in parallel parameters of single qubit quantum gates that operate on the data qubits; and selecting sets of CNOT gates defining a same direction and optimizing in parallel parameters for the selected CNOT gates.

Other implementations of this aspect include corresponding computer systems, apparatus, and computer programs recorded on one or more computer storage devices, each configured to perform the actions of the methods. A system of one or more computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination.

In some implementations, the plurality of data qubits and measurement qubits are interleaved such that the plurality of data qubits and measurement qubits defines a one-dimensional chain of qubits and the plurality of directions comprises a first direction and a second direction opposite to the first direction.

In other implementations, the plurality of single quantum qubit gates are phase shift gates or rotation gates.

In some cases, the data qubit is a control qubit and the neighboring measurement qubit is a target qubit for each CNOT gate.

In other cases, the data qubit is a target qubit and the neighboring measurement qubit is a control qubit for each CNOT gate.

In some implementations optimizing in parallel parameters of readout quantum gates that operate on the measurement qubits is a repeated process using closed-loop feedback, wherein each repetition comprises in parallel, for each measurement qubit: defining a corresponding metric for minimization as a determined error rate; measuring the measurement qubit to determine a current error rate; storing the determined current error rate; calculating a change in the error rate between the current error rate and the stored error rate from the previous repetition; and adjusting the readout gate parameters based on the calculated change in error rate.

In some cases, adjusting the readout gate parameters based on the defined metric for minimization comprises applying a numerical optimization algorithm.

In some implementations optimizing in parallel parameters of single qubit quantum gates that operate on the measurement qubits is a repeated process using closed-loop feedback, wherein each repetition comprises in parallel, for each measurement qubit: defining a corresponding metric for minimization as a determined error rate; measuring the measurement qubit to determine an error rate; storing the determined current error rate; calculating a change in the error rate between the current error rate and the stored error rate from the previous repetition; and adjusting the single qubit gate parameters based on the calculated change in error rate.

In some cases, adjusting the single qubit gate parameters based on the defined metric for minimization comprises applying a numerical optimization algorithm.

In some implementations, optimizing in parallel parameters of single qubit quantum gates that operate on the data qubits is a repeated process using closed-loop feedback, wherein each repetition comprises in parallel, for each data qubit: defining a corresponding metric for minimization as a determined error rate; measuring the corresponding measurement qubits to determine an error rate; storing the determined current error rate; calculating a change in the error rate between the current error rate and the stored error rate from the previous repetition; and adjusting the single qubit gate parameters based on the calculated change in error rate.

In some cases, adjusting the single qubit gate parameters based on the defined metric for minimization comprises applying a numerical optimization algorithm.

In other implementations, selecting sets of CNOT gates defining a same direction and optimizing in parallel parameters for the selected CNOT gates comprises: for each selected set of CNOT gates in parallel, for each data qubit in the selected set: defining a corresponding metric for minimization as a determined error rate; measuring the corresponding measurement qubits to determine an error rate; storing the determined current error rate; calculating a change in the error rate between the current error rate and the stored error rate from the previous repetition; and adjusting the CNOT gate parameters based on the calculated change in error rate.

In some cases, adjusting the single qubit gate parameters based on the defined metric for minimization comprises applying a numerical optimization algorithm.

The subject matter described in this specification can be implemented so as to realize one or more of the following advantages. By continuously and effectively optimizing physical gate parameters, and hence qubit performance, in-situ whilst error correction is running, the performance of the quantum computer implementing parallel optimization of continuously running error correction can achieve improved performance and reliability compared to quantum computers employing other characterization methods that may require interruption of necessary error detection operations and other computations. For example, a quantum computer implementing parallel optimization of continuously running error correction can combat system drift, i.e., the drift of optimal parameters as a result of system hardware changes, e.g., due to temperature, for each parameter of each gate for each qubit whilst the system is running without interrupting a computation.

In many situations, detection events are the only information available that reflect system performance while error detection is running. A quantum computer implementing parallel optimization of continuously running error correction requires detection events, which is an important technique that is applicable to many different forms of error correction.

In addition, a quantum computer implementing parallel optimization of continuously running error correction achieves improved performance in the error correction circuit compared to other characterization methods, since a major challenge of error correction operations is knowing how a gate characterized with other methods will actually perform in an error detection circuit in a many-qubit system. Qubits that store data are generally not measured during a computation, yet still require optimization, which may be achieved by parallel optimization of continuously running error correction.

A quantum computer implementing parallel optimization of continuously running error correction may be model free, e.g., the initial description may be model free, and avoids the need to build an error-model. A quantum computer implementing parallel optimization of continuously running error correction may therefore also avoid the need to gather statistics regarding various error types for use in training such an error-model, which, in order to gather sufficient statistics, requires that the physical system is far below the threshold such that individual first-order errors are sparse, thus saving time and required computational resources compared to other characterization methods.

Furthermore, a quantum computer of arbitrary size implementing parallel optimization of continuously running error correction may achieve a high level of scalability, e.g., O(1), for optimizing each gate in the quantum computer.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This specification describes a quantum system and method for continuously and effectively optimizing qubit performance in-situ whilst an error correction operation on the quantum system is running. The method directly monitors the output from error detection and provides this information as feedback to calibrate the quantum gates associated with the quantum system. In some implementations, the physical qubits are spatially partitioned into one or more independent hardware patterns, i.e., configurations, where the errors attributable to each hardware pattern are non-overlapping. The one or more different sets of hardware patterns are then temporarily interleaved such that all physical qubits and operations are optimized. The method allows for the optimization of each section of a hardware pattern to be performed individually and in parallel, and can result in O(1) scaling.

Example Operating Environment

Figure 1A:
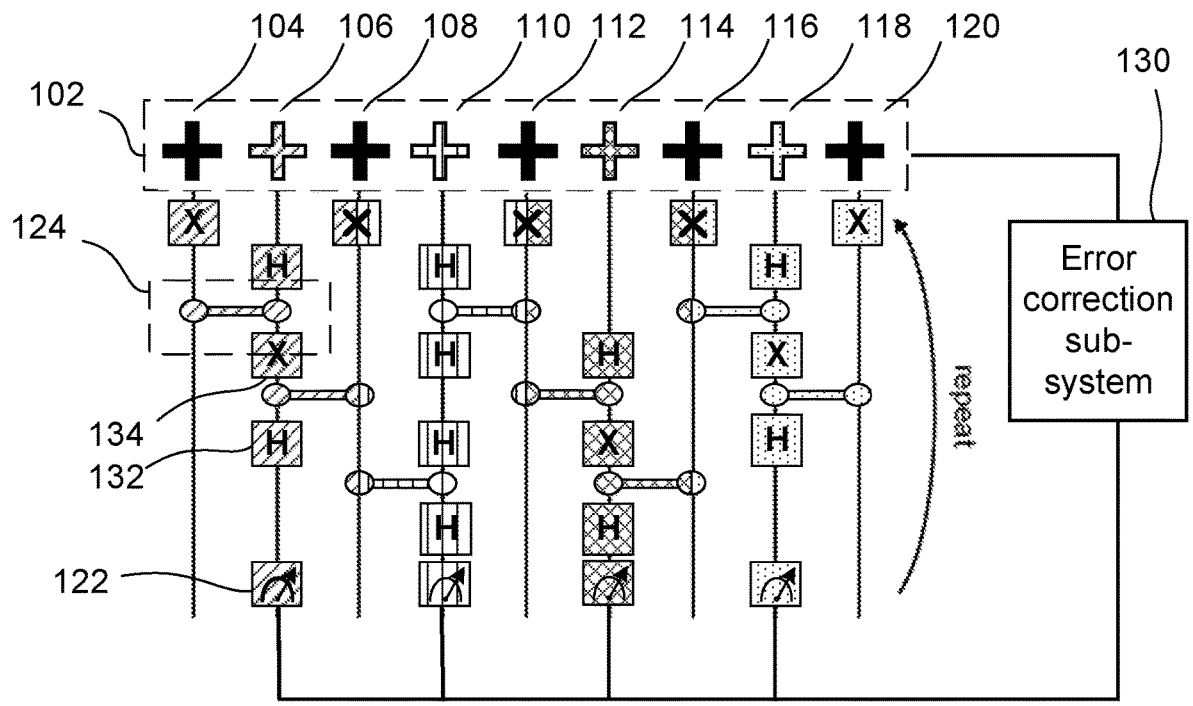
FIG. 1A is a one-dimensional schematic perspective of an example error correction system.

FIG. 1A is a one-dimensional schematic perspective of an example error correction system 100 for the repetition code. The system 100 is a one-dimensional partition of the two-dimensional surface code. The system includes a one-dimensional array of qubits 102. For clarity, nine qubits are depicted in FIG. 1A, however the system may include a much larger number of qubits, e.g., millions of qubits. The array of qubits includes data qubits, e.g., data qubits labeled 104, 108, 112, 116, and 120, interleaved with measurement qubits, e.g., measurement qubits labeled 106, 110, 114, and 118. In the case of bit-flip error detection, the qubits may be measure-Z type qubits.

The system may include a set of readout quantum gates, e.g., readout quantum gate 122. The readout gates may be configured to operate on the measurement qubits, e.g., measurement qubits 106, 110, 114 and 118. Each readout gate may provide the state of the corresponding measurement qubit, and may be associated with a corresponding set of physical readout gate parameters.

The system may include a set of single qubit quantum gates, e.g., single qubit gates 132 and 134. The single qubit quantum gates may be configured to operate on either a single data qubit or a single measurement qubit. The single qubit gates depicted in FIG. 1A include Pauli X gates, e.g., Pauli X gate 134, and Hadamard gates, e.g., Hadamard gate 132, however in some implementations the system may include other single qubit gates. For example, the single qubit gates may include arbitrary phase shift gates or rotation gates. Each single qubit quantum gate may be associated with a corresponding set of physical single qubit quantum gate parameters.

The system may include a set of controlled NOT (CNOT) gates, e.g., CNOT gate 124. Controlled gates may act on two or more qubits, where one or more of the qubits may act as a control for some operation. CNOT gates may operate on two qubits, a control qubit and a target qubit, and perform a NOT operation on the target qubit only when the control qubit is 1). The CNOT gates in FIG. 1A are configured to operate on pairs of neighboring measurement and data qubits, with one qubit acting as the control qubit and the other a target qubit, e.g., CNOT gate 124 operates on the pair of neighboring qubits 104 and 106. If error detection is designed to detect bit-flip errors, each data qubit operated on by a CNOT gate may be the control qubit, and each neighboring measurement qubit may be a corresponding target qubit. Each CNOT gate may be associated with a corresponding set of physical CNOT gate parameters.

The CNOT gates, e.g., 124, operating on the target qubits, e.g., 106, may define one or more directions relative to the target qubit, for example, as shown in FIG. 1A, left and right of the target qubit. In the example of the repetition code, as depicted in FIG. 1A, the CNOT quantum gates may copy bit-flip errors from the associated data qubit onto the associated measurement qubit for detection. In another example, if the error detection is designed to detect phase flip errors, a measurement qubit may be the control qubit and a neighboring data qubit may be the target qubit. The CNOT quantum gates may then copy phase flip errors from the associated measurement qubit onto the associated data qubit.

The system may include an error correction subsystem 130 that is in data communication with the qubits 102. The error correction subsystem may be configured to monitor the output from error detection and feed this information back to the system in order to calibrate the quantum gates. The error correction subsystem 130 may spatially partition the qubits 102 into one or more hardware patterns and perform quantum measurements on the measurement qubits in each hardware pattern. The one or more hardware patterns may be independent, such that an optimization of each hardware pattern relative to each other may be essentially independent. Partitioning qubits into one or more hardware patterns is described in more detail below with reference to FIG. 2. A measurement output, or detection event, may show changes in the measured pattern of states for measurement qubits, which indicates the nearby presence of errors, whether the error occurs on the associated data qubit or measurement qubit. Therefore, measurement outputs in and of themselves may not be directly correlated to errors on data qubits or measurement qubits. Correlating errors and gate parameters will be discussed in more detail below with reference to FIG. 2A-2B.

The error correction subsystem 130 may use the results of the performed quantum measurements to calculate relevant quantities of interest, or metrics, such as a current error rate for each measurement qubit. The error correction subsystem 130 may also perform additional calculations using the results of the performed quantum measurements, such as calculating average values of a determined error rate for one or more measured measurement qubits, or determining a change of error rate in time. The error correction subsystem 130 may include a data store, and may store the results of performed quantum measurements or additional calculations.

The error correction subsystem may use the results of the performed measurements to optimize the parameters of the quantum gates acting on the qubits 102. For example, the error correction subsystem 130 may implement a numerical optimization algorithm, such as a Nelder-Mead algorithm, to determine an appropriate adjustment of the quantum gate parameters, e.g., a minimizing set of quantum gate parameters. Once an appropriate adjustment has been determined, the error correction subsystem may provide the adjustments as feedback to the qubits 102 and adjust the parameters of the quantum gates accordingly.

Figure 1B:
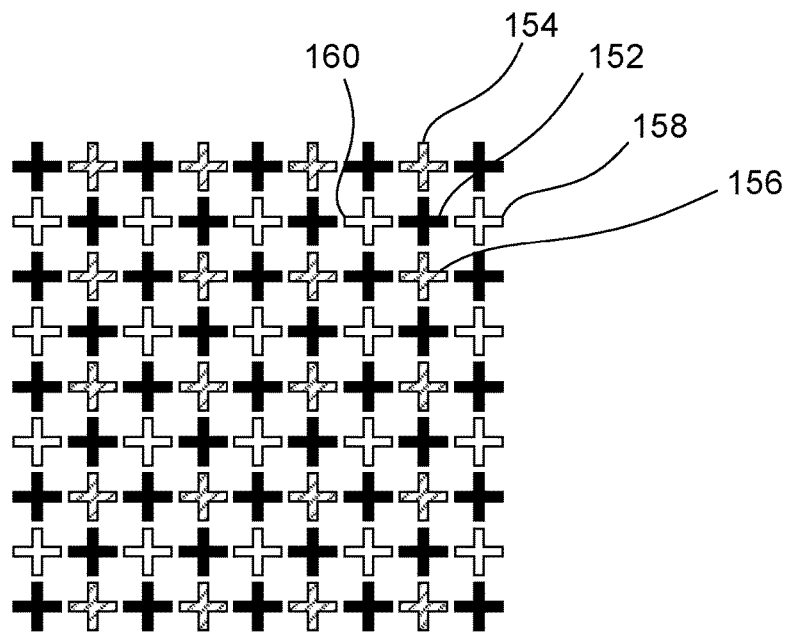
FIG. 1B is a two-dimensional schematic perspective of qubits in an example error correction system.

FIG. 1B is a two-dimensional schematic perspective of qubits 150 in an example error correction system. The system may include a two-dimensional array of qubits 150. Again, for clarity, eighty-one qubits are depicted in FIG. 1B, however the system may include a much larger number of qubits, e.g., millions of qubits. The array of qubits may include data qubits, e.g., data qubit labeled 152, interleaved with measurement qubits, e.g., measurement qubits labeled 154, 156, 158, and 160, such that the data qubit has four neighboring measurement qubits to the top, bottom, right and left of the data qubit. FIG. 1B illustrates the scalability of the system 100 of FIG. 1A to higher dimensions.

Figure 2A:
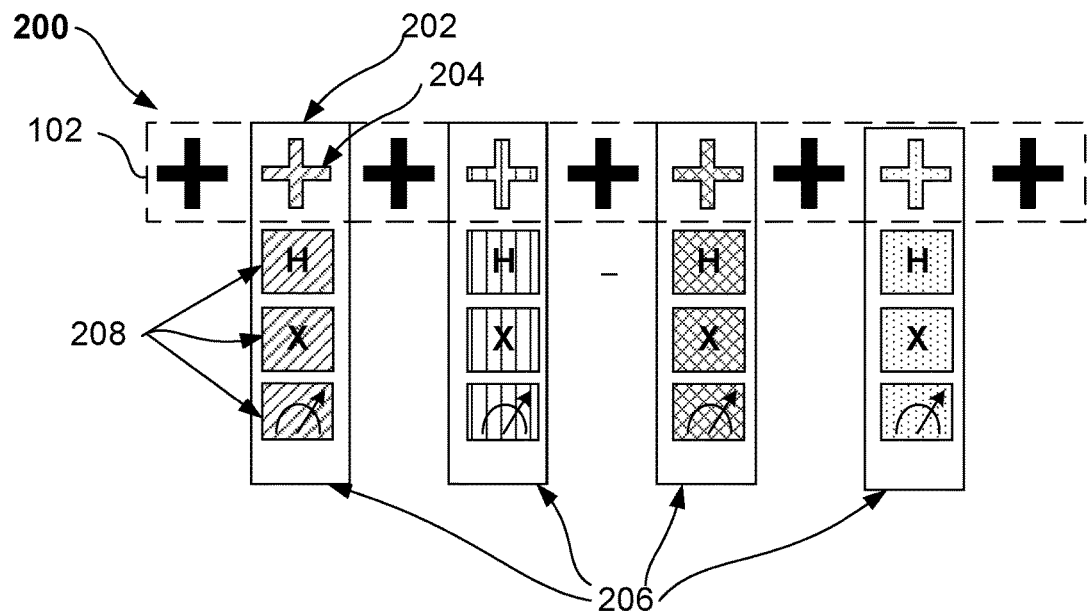
FIG. 2A is a one-dimensional schematic perspective of an example hardware pattern in an error correction system including a one-dimensional array of qubits.
Figure 2B:
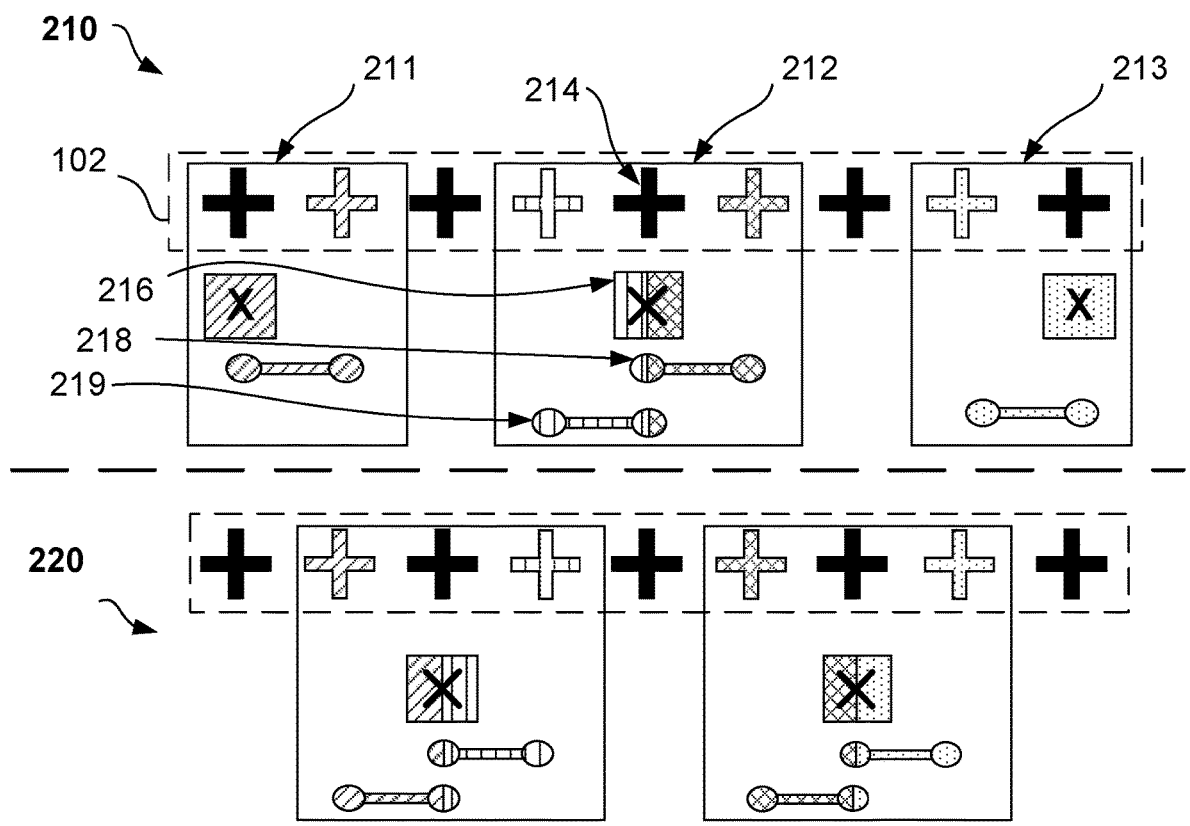
FIG. 2B is a one-dimensional schematic perspective of example hardware patterns in an error correction system including a one-dimensional array of qubits.

The following FIGS. 2A-2B illustrate example hardware patterns used to perform quantum gate optimization.

FIG. 2A is a one-dimensional schematic perspective of an example hardware pattern 200 in an error correction system including a one-dimensional array of qubits. For example, the error correction system may be an error correction system including a one-dimensional array of qubits 102 as described above with reference to FIG. 1A, where gate cross hatching corresponds to which measurement qubit will detect errors from that gate.

The hardware pattern 200 may include four hardware groupings 206, each of which contain a measurement qubit and the corresponding single qubit operations for that qubit, e.g., hardware grouping 202 contains measurement qubit 204 and the corresponding single qubit operations 208. The groupings within a hardware pattern may be operated independently. Errors from the single qubit operations 208 may not propagate to neighboring data qubits, and the relative detection fraction from the measurement qubit may be used to infer changes in gate parameters, as described below with reference to FIG. 6.

In addition, if error detection is designed to detect bit-flip errors and each data qubit operated on by a CNOT gate is the control qubit, and each neighboring measurement qubit is a corresponding target qubit, bit-flip errors may not propagate to data qubits due to the directions of the CNOT gates that are applied to the pairs of data qubits and measurement qubits. Rather, bit-flip errors may be localized to a particular measurement qubit and hence a particular hardware grouping.

Due to the localization of gate errors, measurement qubits may have single qubit quantum gate parameters individually optimized completely in parallel as one hardware pattern 200. By construction, the hardware patterns that the data qubits and measurement qubits are partitioned into may include one pattern including hardware groupings containing only measurement qubits.

FIG. 2B is a one-dimensional schematic perspective of example hardware patterns 210 and 220 in an error correction system including a one-dimensional array of qubits. For example, the error correction system may be an error correction system including a one-dimensional array of qubits 102 as described above with reference to FIG. 1A, where gate cross hatching corresponds to which measurement qubit will detect errors from that gate.

The hardware pattern 210 may include multiple hardware groupings, e.g., hardware grouping 212, each of which contain one data qubit and up to two measurement qubits, along with corresponding single qubit operations for the measurement and data qubits and CNOT gates, e.g., as depicted in FIG. 2B, hardware grouping 212 contains measurement qubit 214, single qubit operation 216 and CNOT gates 218 and 219. The groupings within a hardware pattern may be operated independently. Errors from the single qubit operation 216 and CNOT gates 218 and 219 may not propagate outside the hardware grouping 212, and the detection event fraction of the measurement qubits within each hardware grouping may be used to infer changes in gate parameters for gates within each grouping, as described below with reference to FIGS. 7 and 8.

In addition, if error detection is designed to detect bit-flip errors and each data qubit operated on by a CNOT gate is the control qubit, and each neighboring measurement qubit is a corresponding target qubit, unlike hardware pattern 200, bit flip errors may be copied from data qubits through CNOT gates onto neighboring measurement qubits. Therefore, a single error on a data qubit may generate two detection events on neighboring measurement qubits and it may not be possible to optimize CNOT gate parameters on the same measurement qubit or data qubit in parallel. There may be a natural restriction to the hardware patterns, e.g., 210 and 220. In general, CNOT gates fully contained in a hardware pattern may be optimized in said pattern.

If next-nearest neighboring data qubits simultaneously have their single qubit parameters optimized, they may both copy errors onto the same measurement qubit. Therefore, errors may become confused. To avoid this problem, every other data qubit may be optimized to avoid double mapping errors onto measurement qubits. Two hardware patterns 210 and 220 may be created that can simultaneously have their single qubit parameters optimized without such confusion, e.g., the optimization of both patterns 210 and 220 relative to each other are essentially independent. By construction, the hardware patterns that the data qubits and measurement qubits are partitioned into may include at least one pattern where the corresponding hardware groupings contain both data qubits and measurement qubits.

The hardware patterns 200, 210 and 220 illustrated in FIGS. 2A and 2B constitute the minimum number of hardware patterns that can be used in order to perform error correction in a one-dimensional error correction system, such as that depicted in FIG. 1A. The below table counts the number of patterns that may be interleaved to optimize all gates in parallel. There are 3 interleaved patterns, where in each pattern one gate may be optimized in parallel. This number may be constant for a repetition code of arbitrary size, assuming that the system is performing in an ideal sense, i.e., where qubits do not have any parasitic interactions with qubits that they should not interact with. The illustrated patterns are a minimum set of patterns, and in some implementations more may be added as needed. By choosing such hardware patterns for the system, gate parameters within each hardware grouping in a respective hardware pattern may be optimized by altering the gate parameters and minimizing the measured error rate for each hardware grouping. Furthermore, by choosing a finite number of hardware patterns, each operation required to optimize a quantum computer running error detection may be accessed. When a hardware pattern is chosen, all hardware groupings can be independently optimized in parallel, which is a O(1) scaling strategy for optimizing every single gate in an arbitrarily sized quantum computer.

| Pattern | Qubit | Gate |
|---|---|---|
| 206 | Measurement | Single qubit $\left(\pi, \frac{\pi}{2}\right)$ |
| 206 | Measurement | readout |
| 210 | Data | Single qubit $\left(\pi, \frac{\pi}{2}\right)$ |
| 210 | | CNOT (left) |
| 210 | | CNOT (right) |
| 220 | Data | Single qubit $\left(\pi, \frac{\pi}{2}\right)$ |
| 220 | | CNOT (left) |
| 220 | | CNOT (right) |

Although there are three separate patterns that require optimization, within one pattern there are multiple operations that may be independently optimized. Optimizing gate parameters is described in more detail below with reference to FIGS. 5-8.

The hardware patterns shown in the above table, and described above with reference to FIGS. 2A and 2B, are representative patterns and not exhaustive. The exact patterns and respective groupings can be tailored to the system and determined by tracking error propagation in a particular circuit. For example, the hardware patterns need not be pre-computed in the system software. In some implementations the hardware patterns may be determined by varying parameters on particular gates and observing where the changes in detection events are found. By varying each of the parameters on each of the particular gates in such a manner, generated information may be processed and used to determine the hardware patterns. Such a method of determining hardware patterns may be sensitive to hardware non-idealities and increase system performance and efficiency.

Figure 3:
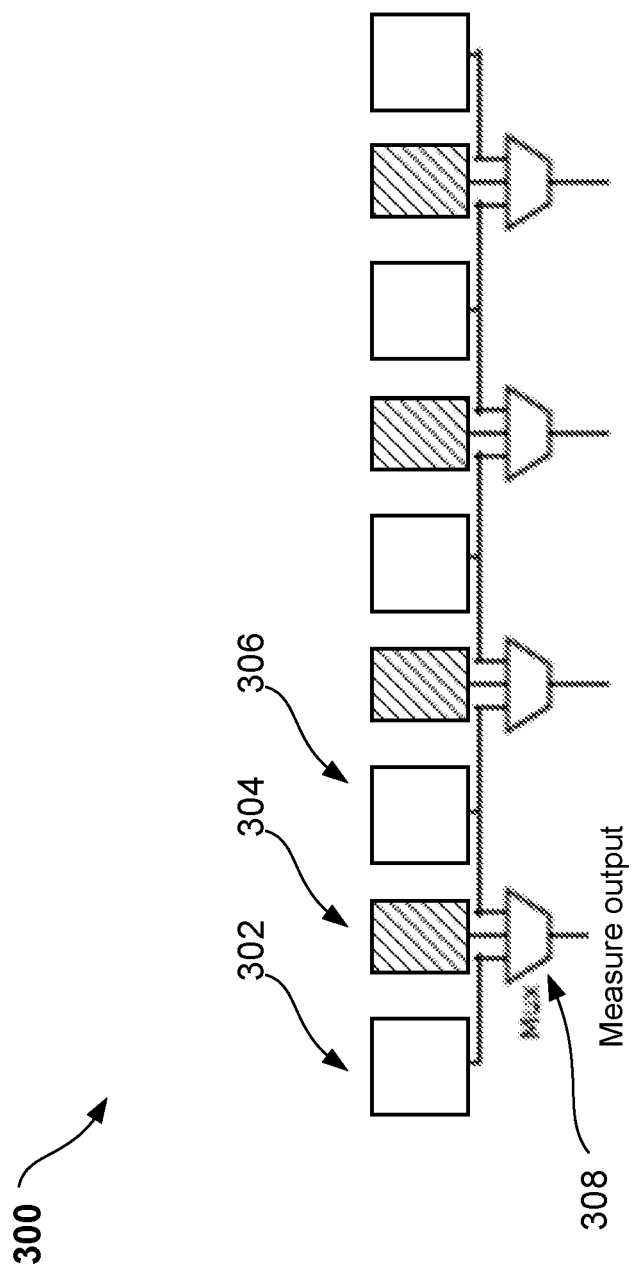
FIG. 3 is a circuit representation of a one-dimensional schematic perspective of qubits in an example error correction system

FIG. 3 is a circuit representation of a one-dimensional schematic perspective of qubits in an example error correction system. In this simplified circuit representation, the output of the measurement qubit 304 may act as a multiplexer 308 with three inputs: one for the associated measurement qubit 304, and one for each neighboring data qubit 302 and 306. In order to directly probe the output of one of the data or measurement boxes, e.g., data boxes 302, 306 and measurement box 304, only one of the inputs to the multiplexer may be chosen at a time. This is where the three hardware patterns 200, 210 and 220 described above with reference to FIGS. 2A-2B originate from.

Figure 4:
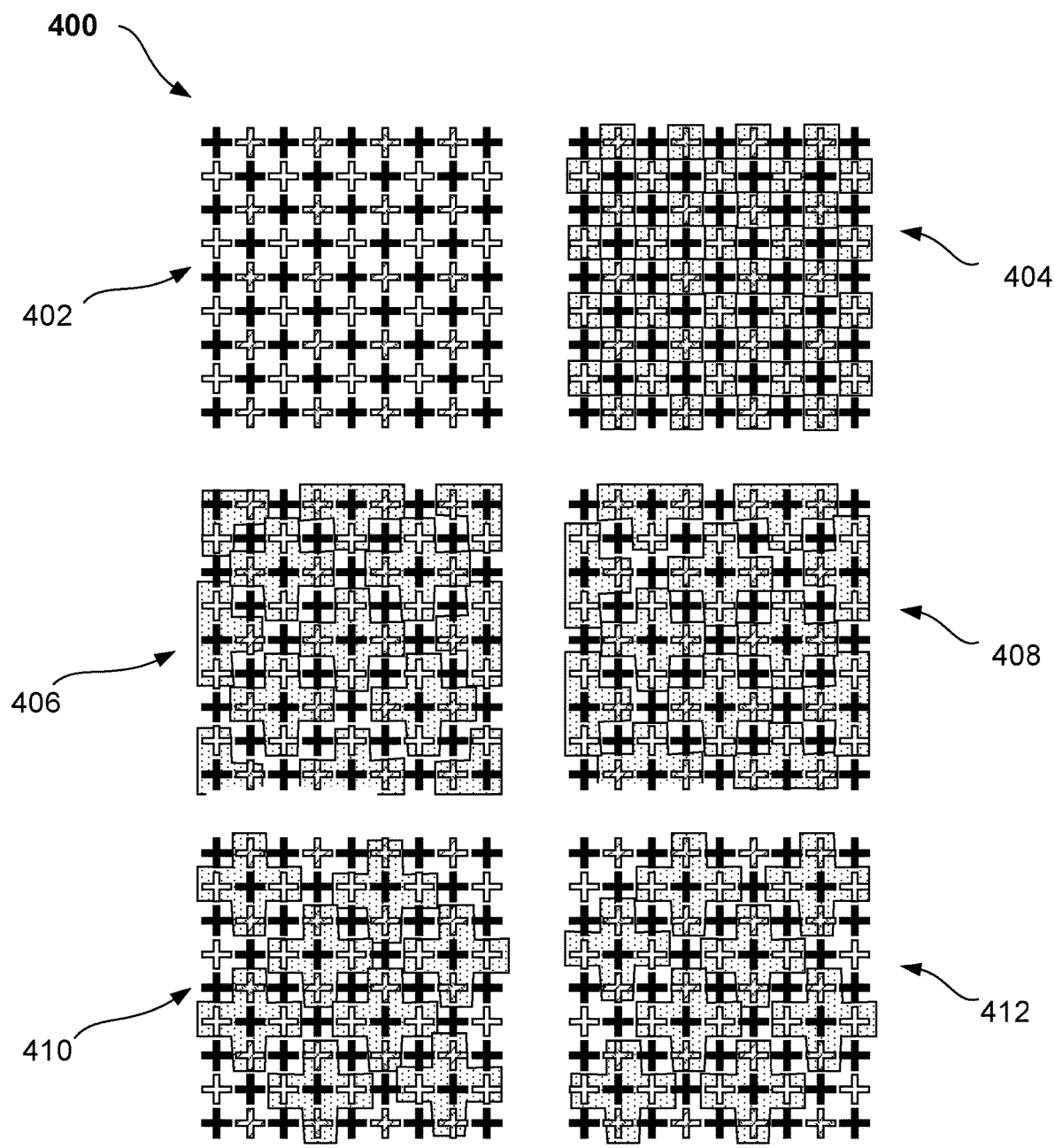
FIG. 4 is a two-dimensional schematic perspective of example hardware patterns in an error correction system.

FIG. 4 is a two-dimensional schematic perspective 400 of example hardware patterns in an error correction system. The same analysis described above with reference to FIGS. 2A-2B may be applied to the surface code in order to generate the illustrated hardware patterns. The hardware patterns may include one hardware pattern 404 including measurement qubits. The remaining hardware patterns 406-412 may include both data qubits and measurement qubits.

The hardware patterns 404-412 illustrated in FIG. 4 constitute the minimum number of hardware patterns that can be used in order to perform error correction for a system including a two-dimensional array of qubits. The below table counts the number of patterns that will be interleaved to optimize all gates in parallel. There are 5 interleaved patterns, where in each pattern one gate may be optimized. The illustrated patterns are representative and not a minimum set. Other patterns exist, and may be more complex. The number and complexity of the patterns depend on the exact details of what order quantum gates are executed across the array. As described above, by choosing such hardware patterns for the system, gate parameters within each hardware grouping in a respective hardware pattern may be optimized by altering the gate parameters and minimizing the measured error rate for each hardware grouping. Furthermore, by choosing a finite number of hardware patterns, each operation required to optimize a quantum computer running error detection may be accessed. When a hardware pattern is chosen, all hardware groupings can be independently optimized in parallel, which is a O(1) scaling strategy for optimizing every single gate in an arbitrarily sized quantum computer.

| Pattern | Qubit | Gate |
| --- | --- | --- |
| 404 | Measurement | Single qubit $\left(\pi, \frac{\pi}{2}\right)$ |
| 404 | Measurement | readout |
| 406 | Data | Single qubit $\left(\pi, \frac{\pi}{2}\right)$ |
| 406 | | CNOT (top) |
| 406 | | CNOT (left) |
| 406 | | CNOT (right) |
| 406 | | CNOT (bottom) |
| 408 | Data | Single qubit $\left(\pi, \frac{\pi}{2}\right)$ |
| 408 | | CNOT (top) |
| 408 | | CNOT (left) |
| 408 | | CNOT (right) |
| 408 | | CNOT (bottom) |
| 410 | Data | Single qubit $\left(\pi, \frac{\pi}{2}\right)$ |
| 410 | | CNOT (top) |
| 410 | | CNOT (left) |
| 410 | | CNOT (right) |
| 410 | | CNOT (bottom) |
| 412 | Data | Single qubit $\left(\pi, \frac{\pi}{2}\right)$ |
| 412 | | CNOT (top) |
| 412 | | CNOT (left) |
| 412 | | CNOT (right) |
| 412 | | CNOT (bottom) |

Although there are five separate patterns that require optimization, within one pattern there are multiple operations that may be independently optimized. Optimizing gate parameters is described in more detail below with reference to FIGS. 5-8.

The hardware patterns shown in the above table, and described above with reference to FIG. 4, are representative patterns and not exhaustive. The exact patterns and respective groupings can be tailored to the system and determined by tracking error propagation in a particular circuit. For example, the hardware patterns need not be pre-computed in the system software. In some implementations the hardware patterns may be determined by varying parameters on particular gates and observing where the changes in detection events are found. By varying each of the parameters on each of the particular gates in such a manner, generated information may be processed and used to determine the hardware patterns. Such a method of determining hardware patterns may be sensitive to hardware non-idealities and increase system performance and efficiency.

The hardware patterns described in this specification are specific for a one-dimensional chain of qubits running the repetition code, but this technique may be generalizable to most error correction schemes. Any scheme that detects errors using groups of qubits of fixed maximum size, and the number of groups that any qubit belongs to does not scale with system size can utilize the hardware and methods described in this specification. For example, the technique may be compatible with all topological codes including subsystem codes, and all concatenated codes by focusing on the lowest level of concatenation. This includes surface and color codes, and the Steane and Shor codes. The hardware and methods described in this specification may not be compatible with finite rate block codes if one wants to preserve O(1) scaling with system size. Hardware patterns and groupings can be found algorithmically by either simulating the error detection circuit, or by physically altering control parameters and determining where the detection fraction changes.

In particular, whilst FIGS. 2A-2B, 3 and 4 have been described for the repetition code and surface code, the methodologies of tracing the error signatures from a gate onto physical measurements can be applied outside of the repetition and surface codes and applied to any quantum circuit and may be used as a way to provide feedback for optimization.

Performing In-Situ Quantum Error Correction

Figure 5:
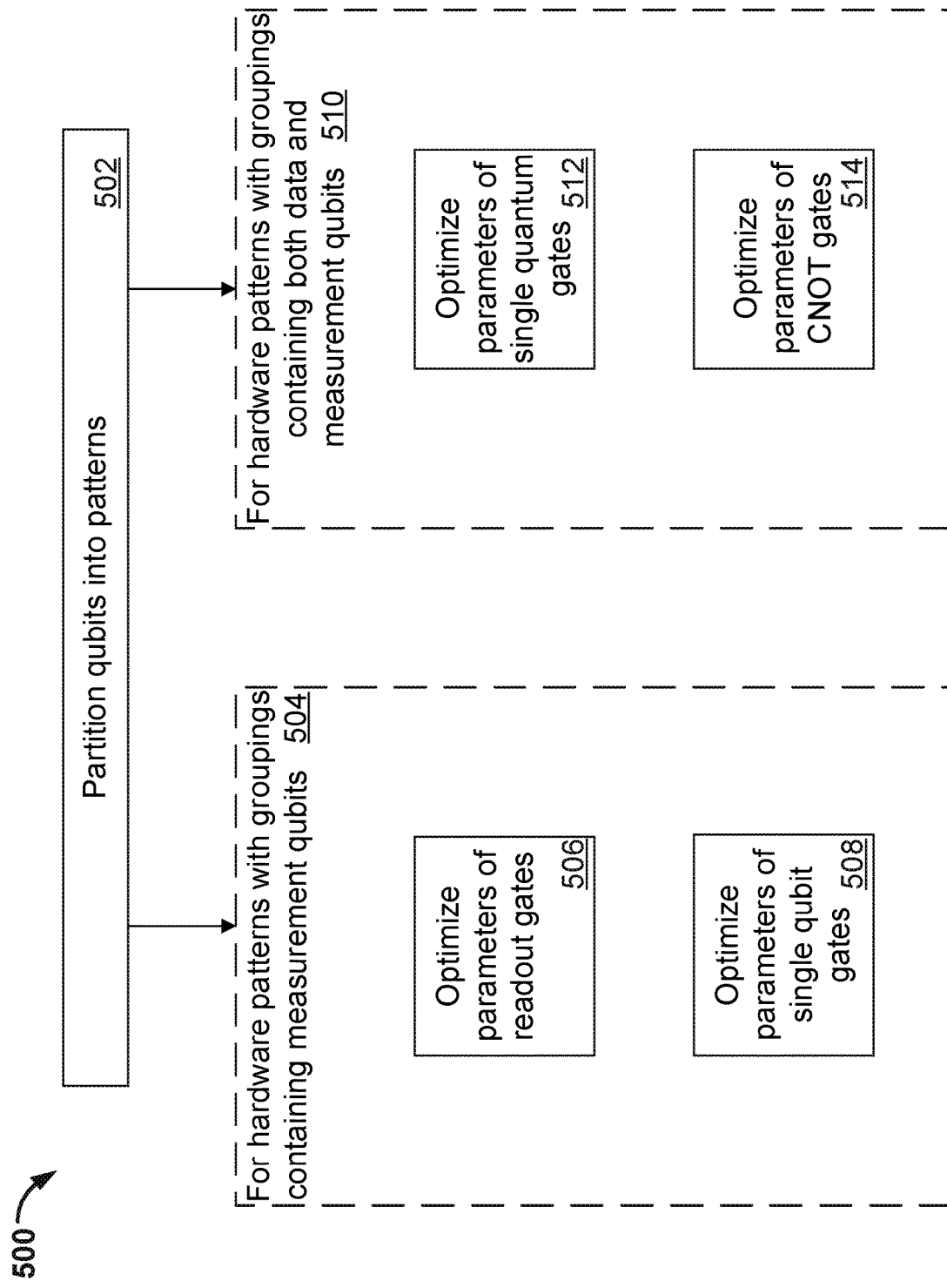
FIG. 5 is a flow diagram of an example process for error correction.

FIG. 5 is a flow diagram of an example process 500 for performing continuous optimization of quantum gate parameters whilst error correction is running. For example, the process 500 may be performed during an error correction procedure by the system 100 or 300 described above with reference to FIGS. 1A-1B and FIG. 3. The process 500 uses error detection to self-diagnose, enabling the continual optimization of control parameters whilst the system is running and hence combating system drift without interrupting a computation.

The system spatially partitions the collection of data qubits and measurement qubits into separate hardware patterns (step 502). The system partitions the collection of data qubits and measurement qubits such that the errors attributable to each separate hardware pattern do not overlap with errors attributable to the other separate hardware patterns. By construction, the hardware patterns may include one pattern with groupings containing measurement qubits, and two or more patterns with groupings containing both data qubits and measurement qubits. The construction of partitioning a collection of data qubits and measurement qubits into separate hardware patterns is described in more detail above with reference to FIGS. 2A-2B and FIG. 4.

The system enters a phase for optimizing the parameters of the quantum gates operating on the qubits in each hardware pattern with groupings containing measurement qubits (step 504). By construction, each of the measurement qubits in the collection of data qubits and measurement qubits may form one of the hardware patterns constructed in step 502. For example, in one-dimension, the system may optimize the parameters of the quantum gates operating on the measurement qubits in the hardware pattern 200 described above with reference to FIG. 2A. In another example, in two-dimensions, the system may optimize the parameters of the quantum gates operating on the measurement qubits in the hardware pattern 404 described above with reference to FIG. 4.

Performing optimization of the parameters of the quantum gates operating on the measurement qubits may be considered the simplest optimization phase. For example, when considering performing error correction on the repetition code, the measurement qubits may detect bit-flip errors. Since the bit-flip errors do not propagate from measurement qubits to data qubits, due to the direction of the CNOT gates that are applied to pairs of measurement and data qubits, errors are localized to a particular measurement qubit. Measurement qubits may therefore have the parameters of the single qubit quantum gates operating on them individually optimized completely in parallel as one hardware pattern, as described below with reference to steps 506 and 508.

The system performs optimization of the parameters of the readout gates operating on the measurement qubits (step 506). The optimization of the parameters of the readout gates operating on the measurement qubits may be performed in parallel for each measurement qubit in the hardware pattern. An example process for optimizing the parameters of the readout gates operating on the measurement qubits is described in detail below with reference to FIG. 6.

The system performs optimization of the parameters of the single qubit quantum gates operating on the measurement qubits (step 508). The optimization of the parameters of the single qubit quantum gates operating on the measurement qubits may be performed in parallel for each measurement qubit in the hardware pattern. An example process for optimizing the parameters of the single qubit quantum gates operating on the measurement qubits is described in detail below with reference to FIG. 6.

The system enters a phase for optimizing the parameters of the quantum gates operating on the qubits in each hardware pattern with groupings containing both data qubits and measurement qubits (step 510). By construction, in each hardware pattern with groupings containing both data and measurement qubits, the data qubits may be accompanied by measurement qubits in their respective hardware groupings constructed in step 502. For example, in one-dimension, the system may optimize the parameters of the single qubit quantum gates operating on the data qubits in the hardware patterns 210 and 220 described above with reference to FIG. 2B. In another example, in two-dimensions, the system may optimize the parameters of the single qubit quantum gates operating on the data qubits in the hardware patterns 406, 408, 410 and 412 described above with reference to FIG. 4.

Performing optimization of the parameters of single qubit quantum gates operating on the data qubits may be more complex than performing optimization of the parameters of the single qubit quantum gates operating on the measurement qubits. For example, when considering performing error correction on the repetition code, bit-flip errors may be copied from a data qubit to a neighboring measurement qubit through a CNOT gate operating on both the data qubit and the measurement qubit. Therefore, a single error on a data qubit may generate an output, or detection event, on each of its neighboring measurement qubits, as described above in with reference to FIGS. 2A and 2B. Data qubits, therefore, may not have the parameters of the single qubit quantum gates operating on them individually optimized completely in parallel as one hardware pattern, since if next-nearest neighboring data qubits simultaneously have their single qubit gate parameters optimized, they may both copy errors onto the same measurement qubit, creating error confusion. Instead, every other data qubit may be optimized in parallel as one hardware pattern, avoiding the double mapping of errors on to measurement qubits, as described below with reference to step 512 and FIG. 6.

The system performs optimization of the parameters of the single qubit gates operating on the data qubits in each hardware patterns with groupings that include both data qubits and measurement qubits (step 512). The optimization of the parameters of the single qubit quantum gates operating on the data qubits in each hardware pattern may be performed separately for each hardware pattern. However, the optimization of the parameters of the single qubit quantum gates operating on the data qubits within each grouping in each hardware pattern may be performed in parallel for each data qubit in the hardware pattern. An example process for optimizing the parameters of the single qubit quantum gates operating on the data qubits is described in detail below with reference to FIG. 7.

Performing optimization of the parameters of the CNOT gates operating on the pairs of data qubits and measurement qubits may also be complex due to error confusion. Errors on data qubits may propagate to measurement qubits on each side of the data qubit involved. Therefore, an error on a data qubit may generate an output, or detection event, on each of its neighboring measurement qubits, as described above with reference to FIG. 2B. The parameters of the CNOT gates operating on the pairs of data qubits and measurement qubits therefore may not be optimized on the same data qubit or measurement qubit in parallel. This naturally restricts the hardware patterns, for example to the same as those described above with reference to step 510. In order to avoid error confusion there may be a simple rule: only CNOT gates fully contained in a hardware pattern may be optimized in said pattern.

The system performs optimization of the parameters of the CNOT gates operating on the pairs of data qubits and measurement qubits in each hardware grouping that includes both data qubits and measurement qubits in the hardware pattern (step 514). The optimization of the parameters of the CNOT gates operating on the pairs of data qubits and measurement qubits in the hardware pattern may be performed separately for each hardware pattern. Furthermore, the system selects CNOT gates that define a same direction within each hardware pattern and optimizes the parameters of the CNOT gates that define the same direction in parallel for each data qubit in the hardware pattern. For example, in one-dimension, for each hardware pattern containing data qubits and measurement qubits, the system may first select the set of CNOT gates that are left of the data qubits and optimize the selected CNOT gate parameters in parallel, then select the set of CNOT gates that are right of the data qubits and optimize the selected CNOT gate parameters in parallel. An example process for optimizing the parameters of the CNOT gates operating on the data qubits and measurement qubits is described in detail below with reference to FIG. 8.

For clarity, the flow diagram of the example process 500 for performing continuous optimization of quantum gate parameters whilst error correction is running has been described with reference to the steps 504-514. However, it may not be necessary that the operations of steps 504-514 are performed sequentially in the presented order. The steps may be performed in different sequences, and may be performed more than once, i.e., as required, before the next step in the sequence is performed For example, in some implementations the system may first enter a phase for optimizing the parameters of the quantum gates operating on the qubits in each hardware pattern containing both data qubits and measurement qubits before entering the phase for optimizing the parameters of the quantum gates operating on the qubits in each hardware pattern containing measurement qubits. Similarly, for example, once a phase for optimizing the parameters of the quantum gates operating on the qubits in each hardware pattern containing measurement qubits has been entered, the system may first perform the optimization step 508 before performing the optimization step 506. By cycling between steps 506, 508, 512 and 514, i.e., by cycling between hardware patterns, system drift on every parameter of every gate for every qubit may be combatted while the system is running.

Figure 6:
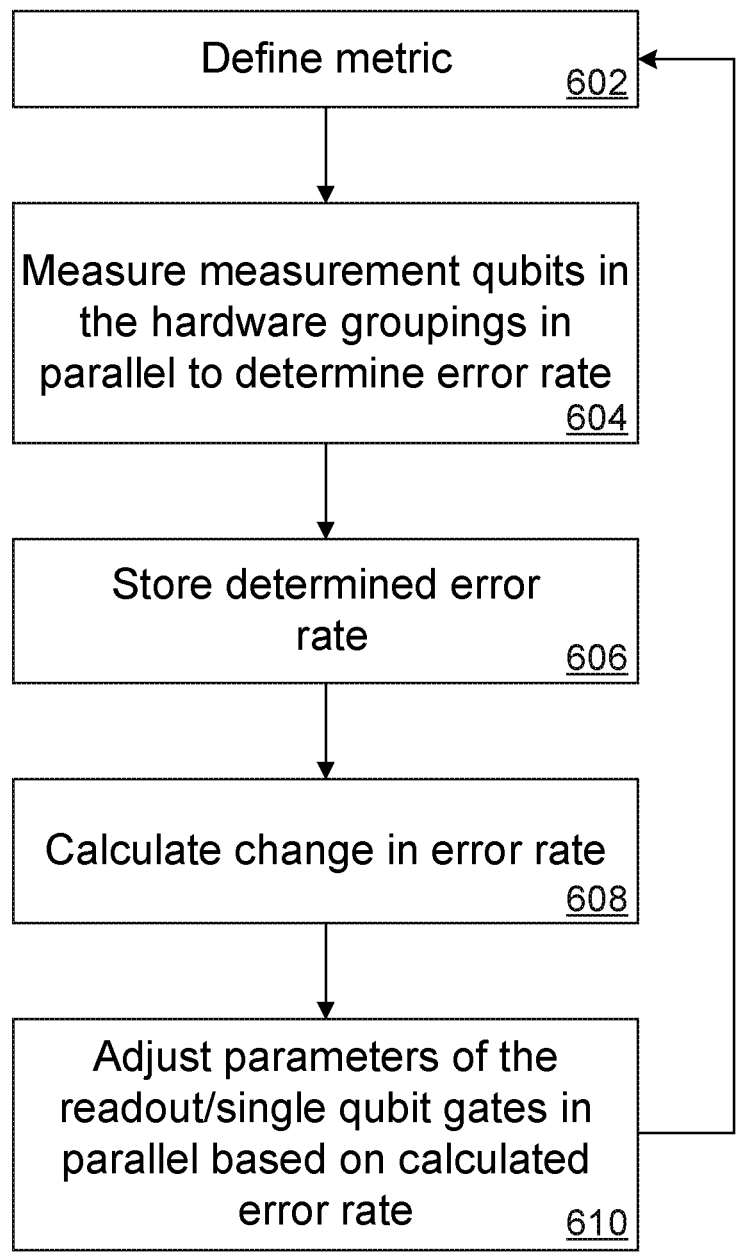
FIG. 6 is a flow diagram of an example process for optimizing single qubit quantum gate parameters on measurement qubits.

FIG. 6 is a flow diagram of an example process 600 for optimizing the parameters of readout gates or single qubit quantum gates operating on measurement qubits. The process 600 may be performed by the system 100 or 300 described above with reference to FIGS. 1A-1B and FIG. 3 for optimizing the parameters of readout quantum gates, as described above in step 506 of FIG. 5, or for optimizing the parameters of single qubit quantum gates, as described above in step 508 of FIG. 5. By construction, each of the measurement qubits in the collection of data qubits and measurement qubits described in FIGS. 1A-1B and FIG. 3 form one of the hardware patterns constructed in step 502 with reference to FIG. 5 above. For example, in one-dimension, the system may optimize the parameters of the readout quantum gates or single qubit quantum gates operating on the measurement qubits in the hardware pattern 202 described above with reference to FIG. 2A. In another example, in two-dimensions, the system may optimize the parameters of the quantum gates operating on the measurement qubits in the hardware pattern 404 described above with reference to FIG. 4.

The process 600 may be performed in parallel for each measurement qubit in the corresponding hardware pattern. The process 600 may be a continuously repeated process that uses closed loop feedback to optimize the parameters of readout gates or single qubit quantum gates operating on measurement qubits.

In parallel, for each measurement qubit, the system defines a corresponding metric for error minimization as a determined error rate (step 602). By minimizing the error rates of each qubit, also called the fraction of detection events, the quantum gate errors may be minimized. In this case of hardware patterns that contain a single measurement qubit, the metric for error minimization may be the fraction of detection events for that qubit. In the case of hardware patterns that contain multiple measurement qubits, such as those depicted in FIGS. 2A and 4, the metric for error minimization is the average fraction of detection events taken over all measurement qubits.

In parallel, for each measurement qubit, the system measures the measurement qubits to determine a current error rate (step 604).

The system stores the determined error rate (step 606). The system stores the determined error rates for each repetition of the process 600 such that the change in error rate may be monitored over time, and correlated with changes made to the quantum gate parameters.

The system calculates a change in the error rate between the determined current error rate and the stored error rate from the previous repetition (step 608). Measurement outputs, or detection events, and changes in the measured patterns of states for measurement qubits may indicate the nearby presence of errors, whether on data qubits or measurement qubits. However, detection events themselves may not be directly correlated to errors on measurement qubits or data qubits. Therefore, in order to correlate a change in error with a change in gate parameters, the change in the localized detection event fraction, i.e., the error rate, may be compared with the change in gate parameters.

In parallel, for each measurement qubit, the system adjusts the readout gate parameters, or the single qubit quantum gate parameters, based on the calculated change in error rate (step 610). The system may apply a numerical optimization algorithm, such as a Nelder-Mead method, to determine the adjustments to be made to the readout gate parameters or single qubit quantum gate parameters, based on the change in error rate calculated in step 608.

The system may continuously repeat the steps 602-610 described above. In principle, it may be possible to distinguish between measure-X and measure-Y qubits in order to obtain more information as to the physical processes associated with the gate errors, and this information may be fed back to the system in order to optimize the quantum gates more efficiently.

Figure 7:
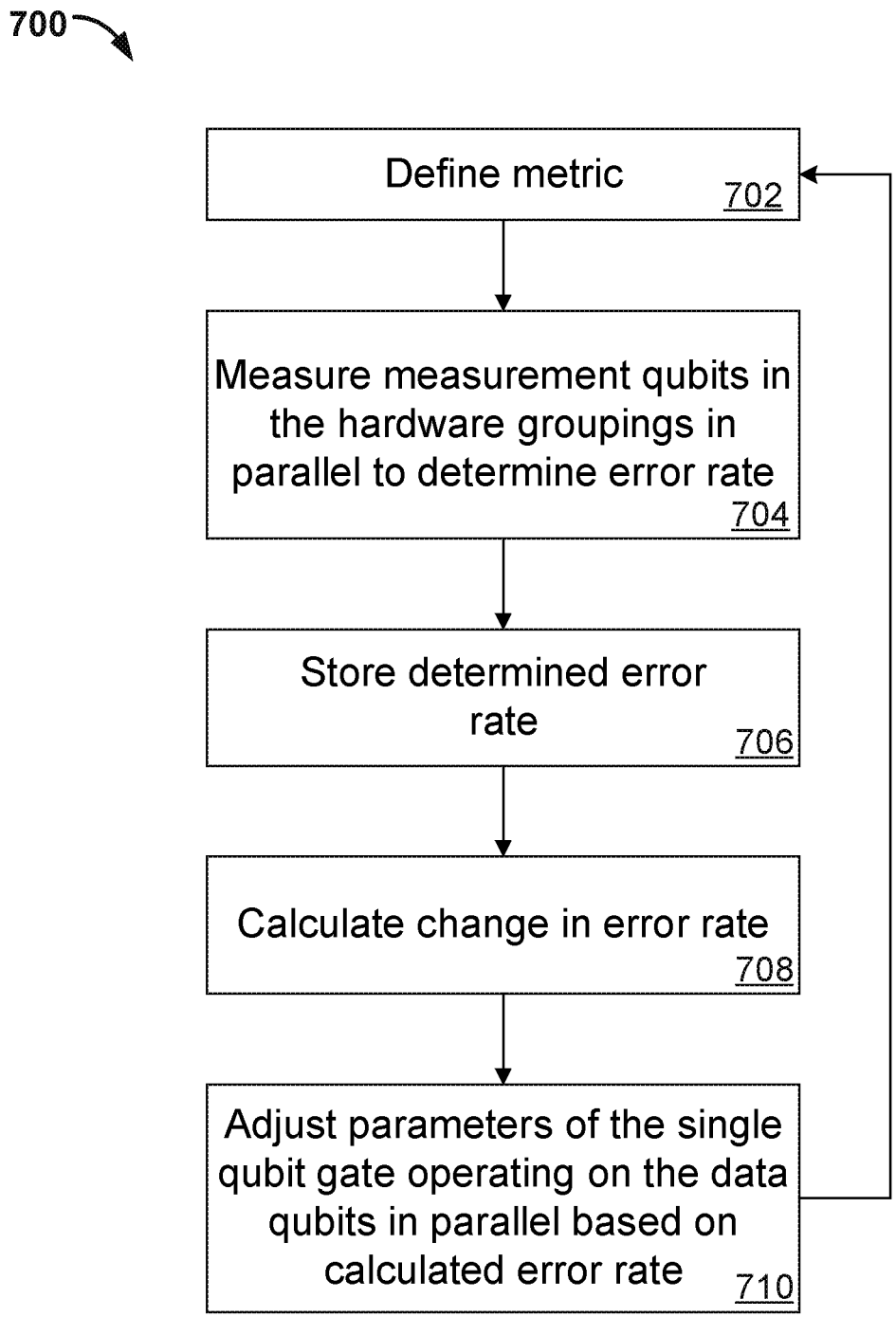
FIG. 7 is a flow diagram of an example process for optimizing single qubit quantum gate parameters on data qubits.

FIG. 7 is a flow diagram of an example process 700 for optimizing the parameters of single qubit quantum gates operating on data qubits. The process 700 may be performed by the system 100 or 300 described above with reference to FIGS. 1A-1B and FIG. 3 for optimizing the parameters of single qubit quantum gates, as described above in step 512 of FIG. 5. The process may be performed for each hardware pattern with groupings including both data qubits and measurement qubits constructed in step 502 with reference to FIG. 5 above. For example, in one-dimension, the system may optimize the parameters of the single qubit quantum gates operating on the data qubits in the hardware patterns 210 and 220 described above with reference to FIG. 2B. In another example, in two-dimensions, the system may optimize the parameters of the quantum gates operating on the measurement qubits in the hardware patterns 406, 408, 410 and 412 described above with reference to FIG. 4.

The process 700 may be performed in parallel for each data qubit in the corresponding hardware pattern. The process 700 may be a continuously repeated process that uses closed loop feedback to optimize the parameters of the single qubit quantum gates operating on the data qubits.

In parallel, for each data qubit, the system defines a corresponding metric for error minimization as a determined error rate (step 702). By minimizing the error rates of each qubit, also called the fraction of detection events, the quantum gate errors may be minimized. In this case of hardware patterns with groupings that contain multiple measurement qubits, such as those depicted in FIGS. 2B and 4, the metric for error minimization may be the average fraction of detection events taken over all measurement qubits.

In parallel, for each data qubit, the system measures the corresponding neighboring measurement qubits to determine a current error rate (step 704). For example, in a one-dimensional system, the system may measure at least two corresponding measurement qubits. For example, in a two-dimensional system, the system may measure at least four corresponding measurement qubits.

The system stores the determined error rates (step 706). The system stores the determined error rates for each repetition of the process 700 such that the change in error rate may be monitored over time, and correlated with changes made to the quantum gate parameters.

The system calculates a change in the error rate between the determined current error rate and the stored error rate from the previous repetition (step 708). Measurement outputs, or detection events, and changes in the measured patterns of states for measurement qubits may indicate the nearby presence of errors, whether on data qubits or measurement qubits. However, detection events themselves may not be directly correlated to errors on measurement qubits or data qubits. Therefore, in order to correlate a change in error with a change in gate parameters, the change in the localized detection event fraction, i.e., the error rate, may be compared with the change in gate parameters.

In parallel, for each data qubit, the system adjusts the single qubit gate parameters based on the calculated change in error rate (step 710). The system may apply a numerical optimization algorithm, such as a Nelder-Mead method, to determine the adjustments to be made to the single qubit quantum gate parameters, based on the change in error rate calculated in step 708.

The system may continuously repeat the steps 702-710 described above. In principle, it may be possible to distinguish between measure-X and measure-Y qubits in order to obtain more information as to the physical processes associated with the gate errors, and this information may be fed back to the system in order to optimize the quantum gates more efficiently.

Figure 8:
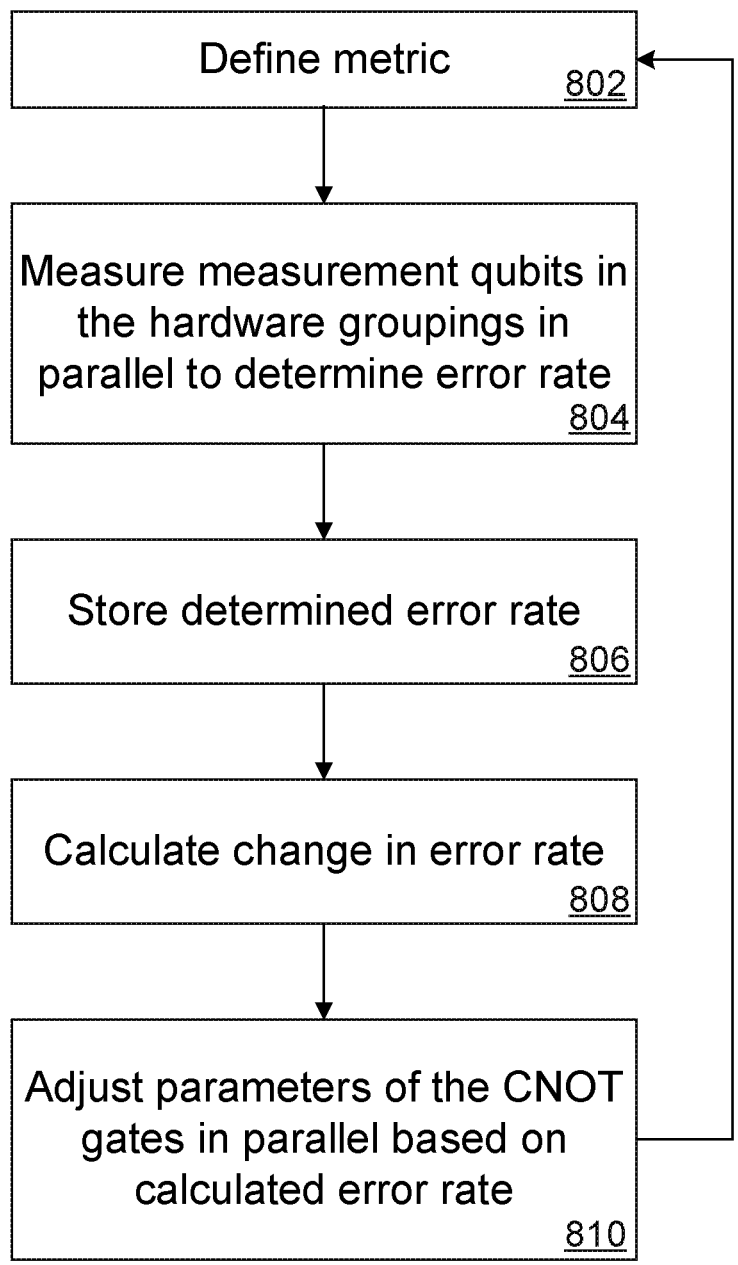
FIG. 8 is a flow diagram of an example process for optimizing CNOT gate parameters.

FIG. 8 is a flow diagram of an example process 800 for optimizing the parameters of CNOT gates operating on pairs of data qubits and measurement qubits. The process 800 may be performed by the system 100 or 300, described above with reference to FIGS. 1A-1B and FIG. 3, for optimizing the parameters of CNOT gates, as described above in step 514 of FIG. 5. The process may be performed for each hardware pattern with groupings including both data qubits and measurement qubits constructed in step 502 with reference to FIG. 5 above. For example, in one-dimension, the system may optimize the parameters of the CNOT gates operating on the pairs of data qubits and measurement qubits in the hardware patterns 210 and 220 described above with reference to FIG. 2B. In another example, in two-dimensions, the system may optimize the parameters of the quantum gates operating on the measurement qubits in the hardware patterns 406-412 described above with reference to FIG. 4.

The process 800 may be performed in parallel for each CNOT gate fully contained in the corresponding hardware pattern that defines a same direction in relation to the data qubit that the CNOT gate operates on. The process 800 may be a continuously repeated process that uses closed loop feedback to optimize the parameters of the CNOT gates.

In parallel, for each data qubit, the system defines a corresponding metric for error minimization as a determined error rate (step 802). By minimizing the error rates of each qubit, also called the fraction of detection events, the quantum gate errors may be minimized. In this case of hardware patterns with groupings that contain multiple measurement qubits, such as those depicted in FIGS. 2B and 4, the metric for error minimization may be the average fraction of detection events taken over all measurement qubits.

In parallel, for each data qubit, the system measures the corresponding neighboring measurement qubits to determine a current error rate (step 804). For example, in a one-dimensional system, the system may measure at least two corresponding measurement qubits. For example, in a two-dimensional system, the system may measure at least four corresponding measurement qubits.

The system stores the determined error rates (step 806). The system stores the determined error rates for each repetition of the process 800 such that the change in error rate may be monitored over time, and correlated with changes made to the quantum gate parameters.

The system calculates a change in the error rate between the determined current error rate and the stored error rate from the previous repetition (step 808). Measurement outputs, or detection events, and changes in the measured patterns of states for measurement qubits may indicate the nearby presence of errors, whether on data qubits or measurement qubits. However, detection events themselves may not be directly correlated to errors on measurement qubits or data qubits. Therefore, in order to correlate a change in error with a change in gate parameters, the change in the localized detection event fraction, i.e., the error rate, may be compared with the change in gate parameters.

In parallel, for each data qubit, the system adjusts the CNOT gate parameters based on the calculated change in error rate (step 810). The system may apply a numerical optimization algorithm, such as a Nelder-Mead method, to determine the adjustments to be made to the CNOT quantum gate parameters, based on the change in error rate calculated in step 808.

The system may continuously repeat the steps 802-810 described above. In principle, it may be possible to distinguish between measure-X and measure-Y qubits in order to obtain more information as to the physical processes associated with the gate errors, and this information may be fed back to the system in order to optimize the quantum gates more efficiently.

Implementations of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A quantum computational system, comprising an error corrector subsystem in data communication with a quantum computer running an error correction procedure on data qubits and measurement qubits, wherein the error corrector subsystem is configured to:
    monitor error detection events that indicate a presence of errors occurring on the data qubits or measurement qubits, wherein the data qubits and measurement qubits are partitioned into a plurality of patterns and errors attributable to each pattern are non-overlapping; and
    calibrate, in parallel with the error correction procedure and based on the monitored error detection events, quantum gate parameters that operate on the data qubits or the measurement qubits, comprising:
        optimizing, for each of multiple patterns of measurement qubits, quantum gate parameters that operate on measurement qubits included in the pattern, and;
        optimizing, for each pattern that includes data qubits and measurement qubits, quantum gate parameters that operate on the data qubits or both the data qubits and measurement qubits.

2. The quantum computational system of claim 1, further comprising:
    a plurality of data qubits;
    a plurality of measurement qubits, interleaving the data qubits such that each data qubit has one or more neighboring measurement qubits;
    a plurality of readout quantum gates, each readout quantum gate configured to operate on a measurement qubit;
    a plurality of single qubit quantum gates, each single qubit quantum gate configured to operate on a data qubit or a measurement qubit; and
    a plurality of CNOT quantum gates, each CNOT quantum gate configured to operate on a data qubit and a neighboring measurement qubit, and each CNOT gate defines one of a plurality of directions.

3. The quantum computational system of claim 2, wherein the plurality of data qubits and measurement qubits are interleaved such that the plurality of data qubits and measurement qubits defines a one-dimensional chain of qubits and the plurality of directions comprises a first direction and a second direction opposite to the first direction.

4. The quantum computational system of claim 2, wherein the plurality of single qubit quantum gates are phase shift gates or rotation gates.

5. The quantum computational system of claim 2, wherein the data qubit is a control qubit and the neighboring measurement qubit is a target qubit for each CNOT gate.

6. The quantum computational system of claim 2, wherein the data qubit is a target qubit and the neighboring measurement qubit is a control qubit for each CNOT gate.

7. The quantum computational system of claim 1, wherein to optimize quantum gate parameters the error correction subsystem is configured to perform a repeated process using closed-loop feedback, wherein at each repetition the error correction subsystem is configured to:
  define a corresponding metric for minimization as a determined error rate;
  measure the measurement qubit to determine a current error rate;
  store the determined current error rate;
  calculate a change in the error rate between the current error rate and the stored error rate from a previous repetition; and
  adjust the quantum gate parameters based on the calculated change in error rate.

8. The quantum computational system of claim 7, wherein to adjust the quantum gate parameters based on the calculated change in error rate the error correction subsystem is configured to apply a numerical optimization algorithm.

9. A computer implemented method comprising:
  monitoring a quantum computer running an error correction procedure on data qubits and measurement qubits, the monitoring comprising monitoring for error detection events that indicate a presence of errors occurring on the data qubits or measurement qubits, wherein the data qubits and measurement qubits are partitioned into a plurality of patterns and errors attributable to each pattern are non-overlapping; and
  calibrating, in parallel with the error correction procedure and based on the monitored error detection events, quantum gate parameters that operate on the data qubits or the measurement qubits, the calibrating comprising:
    optimizing, for each of multiple patterns of measurement qubits, quantum gate parameters that operate on measurement qubits included in the pattern, and;
    optimizing, for each pattern that includes data qubits and measurement qubits, quantum gate parameters that operate on the data qubits or both the data qubits and measurement qubits.

10. The method of claim 9, wherein the quantum computer further comprises:
  a plurality of data qubits;
  a plurality of measurement qubits, interleaving the data qubits such that each data qubit has a neighboring measurement qubit;
  a plurality of readout quantum gates, each readout quantum gate configured to operate on a measurement qubit;
  a plurality of single qubit quantum gates, each single qubit quantum gate configured to operate on a data qubit or a measurement qubit; and
  a plurality of CNOT quantum gates, each CNOT quantum gate configured to operate on a data qubit and a neighboring measurement qubit, and each CNOT gate defines one of a plurality of directions.

11. The method of claim 10, wherein the plurality of data qubits and measurement qubits are interleaved such that the plurality of data qubits and measurement qubits defines a one-dimensional chain of qubits and the plurality of directions comprises a first direction and a second direction opposite to the first direction.

12. The method of claim 10, wherein the plurality of single qubit quantum gates are phase shift gates or rotation gates.

13. The method of claim 10, wherein the data qubit is a control qubit and the neighboring measurement qubit is a target qubit for each CNOT gate.

14. The method of claim 10, wherein the data qubit is a target qubit and the neighboring measurement qubit is a control qubit for each CNOT gate.

15. The method of claim 9, wherein optimizing quantum gate parameters comprises using closed-loop feedback, wherein each repetition comprises:
  defining a corresponding metric for minimization as a determined error rate;
  measuring the measurement qubit to determine a current error rate;
  storing the determined current error rate;
  calculating a change in the error rate between the current error rate and the stored error rate from a previous repetition; and
  adjusting the quantum gate parameters based on the calculated change in error rate.

16. The method of claim 15, wherein adjusting the quantum gate parameters based on the calculated change in error rate comprises applying a numerical optimization algorithm.

* * * * *